US009007823B2

(12) United States Patent
Kurita et al.

(10) Patent No.: US 9,007,823 B2
(45) Date of Patent: Apr. 14, 2015

(54) SEMICONDUCTOR DEVICE

(75) Inventors: Takahiro Kurita, Kawasaki (JP);
Yoshifumi Nishi, Yokohama (JP);
Kosuke Tatsumura, Kawasaki (JP);
Atsuhiro Kinoshita, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 13/480,853

(22) Filed: May 25, 2012

(65) Prior Publication Data

US 2013/0077397 A1 Mar. 28, 2013

(30) Foreign Application Priority Data

Sep. 26, 2011 (JP) ................................. 2011-209688

(51) Int. Cl.
*G11C 11/34* (2006.01)
*H01L 21/28* (2006.01)
*G11C 7/02* (2006.01)
*G11C 11/403* (2006.01)
*H01L 29/423* (2006.01)
(Continued)

(52) U.S. Cl.
CPC ............ *H01L 21/28291* (2013.01); *G11C 7/02* (2013.01); *G11C 11/403* (2013.01); *H01L 21/28282* (2013.01); *H01L 29/4234* (2013.01); *H01L 29/516* (2013.01); *H01L 27/108* (2013.01); *H01L 27/10873* (2013.01)

(58) Field of Classification Search
CPC ............................. G11C 16/0466; G11C 16/10
USPC .......................... 365/184, 205, 206, 207, 203
See application file for complete search history.

(56) References Cited

U.S. PATENT DOCUMENTS

| 5,122,986 | A |   | 6/1992 | Lim |
| 5,737,261 | A | * | 4/1998 | Taira .............................. 365/145 |
| 5,737,274 | A | * | 4/1998 | Hunt et al. ..................... 365/205 |

(Continued)

FOREIGN PATENT DOCUMENTS

| JP | 51-35243 A | 3/1976 |
| JP | 8-102182 A | 4/1996 |
| JP | 10-4148 A | 1/1998 |
| JP | 2000-251478 A | 9/2000 |
| TW | 462127 | 11/2001 |
| WO | WO 00/70675 A1 | 11/2000 |

OTHER PUBLICATIONS

Dinesh Somasekhar, et al., "2 GHz 2 Mb 2T Gain Cell Memory Macro With 128 GBytes/sec Bandwidth in a 65 nm Logic Process Technology", IEEE Journal of Solid-State Circuits, vol. 44, No. 1, Jan. 2009, pp. 174-185.

(Continued)

*Primary Examiner* — Son Dinh
(74) *Attorney, Agent, or Firm* — Oblon, McClelland, Maier & Neustadt, L.L.P.

(57) ABSTRACT

A semiconductor device according to an embodiment includes: a first transistor including a gate connected to a first interconnection, a first source, and a first drain, one of the first source and the first drain being connected to a second interconnection; and a second transistor including a gate structure, a second source, and a second drain, one of the second source and second drain being connected to a third interconnection and the other of the second source and second drain being connected to a fourth interconnection. The gate structure includes a gate insulation film, a gate electrode, and a threshold-modulating film provided between the gate insulation film and the gate electrode to modulate a threshold voltage, the other of the first source and first drain of the first transistor is connected to the gate electrode.

18 Claims, 14 Drawing Sheets

(51) Int. Cl.
*H01L 29/51* (2006.01)
*H01L 27/108* (2006.01)

(56) References Cited

U.S. PATENT DOCUMENTS

| | | | |
|---|---|---|---|
| 5,943,270 A | 8/1999 | Borkar | |
| 7,230,868 B2* | 6/2007 | Madan et al. | 365/207 |
| 7,307,866 B2* | 12/2007 | Yamaoka et al. | 365/145 |
| 2011/0198685 A1 | 8/2011 | Kim et al. | |

OTHER PUBLICATIONS

Office Action issued Sep. 10, 2013 in Korean Patent Application No. 10-2012-0050927 with English language translation.
Office Action issued Aug. 15, 2014 in Japanese Patent Application No. 2011-209688 (with English language translation).
Taiwanese Office Action issued May 21, 2014, in Taiwan Patent Application No. 101118249 (with English translation).

* cited by examiner

SEMICONDUCTOR DEVICE

CROSS-REFERENCE TO RELATED APPLICATION

This application is based upon and claims the benefit of priority from prior Japanese Patent Application No. 2011-209688 filed on Sep. 26, 2011 in Japan, the entire contents of which are incorporated herein by reference.

FIELD

Embodiments described herein relate generally to a semiconductor device.

BACKGROUND

As a high density, high capacity semiconductor memory, the DRAM (Dynamic Random Access Memory) is known. This DRAM includes a memory cell formed of one transistor and one capacitor. This memory cell has a structure in which a transistor M capable of being turned on/off depending upon a word line WL and a capacitor C are connected in series between a bit line (BL) and a common potential line (for example, a ground line GND). The memory cell records data using a difference in charge quantity stored on the capacitor. At the time of reading, a potential on a bit line is changed directly by the charge stored on the capacitor and the change is amplified by a sense amplifier to read whether stored information is "1" or "0." In this DRAM, the charge stored on the capacitor gets away due to a leak current even in a state in which data is held (the transistor is in an off-state). Therefore, it becomes necessary to write back data periodically, i.e., to conduct operation of writing information which is read (hereafter referred to as refresh operation as well) periodically. It is required of the capacitor to be able to retain stored information for a given time (referred to as retention time as well) and have a capacitance capable of changing the potential on the bit line to an extent that the sense amplifier can read.

As the memory cell is miniaturized, however, it is necessary to make the area of the capacitor as well small and consequently it is becoming difficult to ensure the sufficient capacitance. Contrivances such as three-dimensional construction of the capacitor and use of a high dielectric as an insulation film have been made to secure the capacitance. As the generation advances, however, it is necessary to develop a new material and scaling is becoming difficult more and more.

Therefore, a two-transistor type DRAM having a configuration in which the capacitor is replaced with a transistor and charge is stored in a control electrode of the transistor and having a write transistor and a read transistor is proposed. On/off of the write transistor is controlled by a write word line, and charge is sent from a write bit line to the control electrode of the read transistor. At time of reading, it is distinguished whether information stored in the memory cell is "1" or "0" depending upon whether a current flows between a read bit line and a read word line. This two-transistor type DRAM is suitable for size shrinking in that it is formed of only transistors and it is not necessary to look for a new structure and a new material of the capacitor.

In this two-transistor type DRAM, however, a capacitor which stores charge is a gate capacitor of a transistor and its capacitance is small. As a result, the retention time is short and frequent refresh operations are required. Furthermore, normal reading cannot be conducted due to noise at times.

DETAILED DESCRIPTION

A semiconductor device according to an embodiment includes: a first transistor including a gate connected to a first interconnection, a first source, and a first drain, one of the first source and the first drain being connected to a second interconnection; and a second transistor including a gate structure, a second source, and a second drain, one of the second source and second drain being connected to a third interconnection and the other of the second source and second drain being connected to a fourth interconnection. The gate structure includes a gate insulation film, a gate electrode, and a threshold-modulating film provided between the gate insulation film and the gate electrode to modulate a threshold voltage, the other of the first source and first drain of the first transistor is connected to the gate electrode.

Hereafter, embodiments will be described with reference to the drawings.

First Embodiment

Figure 1:
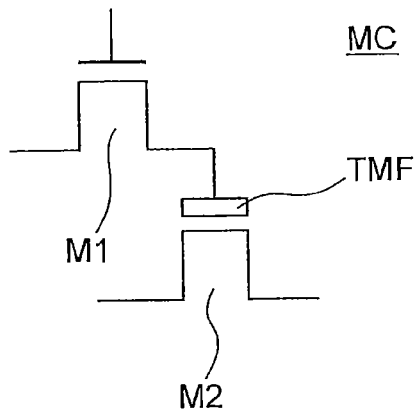
FIG. 1 is a diagram showing a configuration of a memory cell according to a first embodiment.
Figure 2:
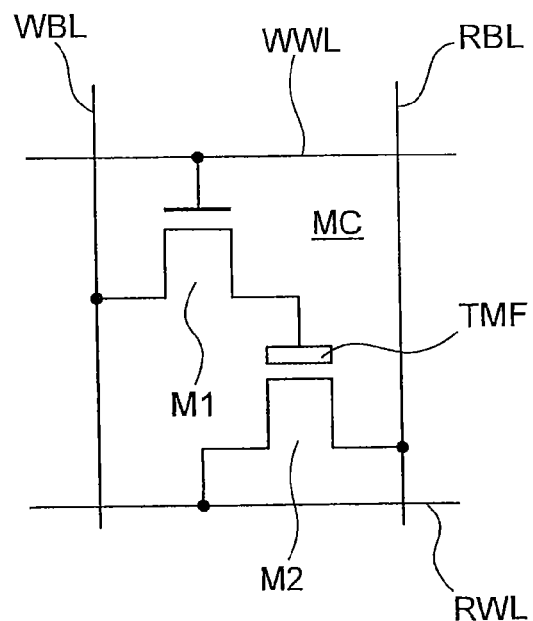
FIG. 2 is a circuit diagram showing the memory cell according to the first embodiment.

FIG. 1 shows a semiconductor device according to a first embodiment. The semiconductor device according to the present embodiment is a two-transistor type DRAM and it includes at least one memory cell. FIGS. 1 and 2 are a diagram showing a configuration of the memory cell and a circuit diagram, respectively. This memory cell MC includes a write transistor M1 and a read transistor M2. The write transistor M1 is connected at one of its source and drain to a bit line WBL, connected at the other of its source and drain to a gate of the read transistor M2, and connected at its gate to a write word line WWL. The read transistor M2 is connected at one of its source and drain to a read bit line RBL and connected at the other of its source and drain to a read word line RWL. The write transistor M1 is an ordinary MOSFET. Unlike the write transistor M1, the read transistor M2 has a threshold-modulating film (hereafter referred to as TMF as well) in its gate structure.

Figure 3:
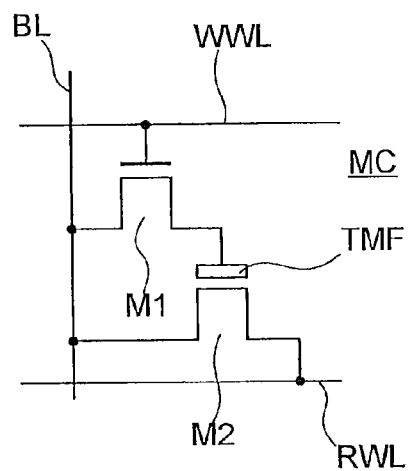
FIG. 3 is a circuit diagram showing a memory cell according to a modification of the first embodiment.

As a modification of the first embodiment, a memory cell MC in which the write bit line WBL and the read bit line RBL are replaced with a common bit line BL and the read transistor M2 and the write transistor M1 share the bit line BL can be mentioned as shown in FIG. 3.

Figure 4:
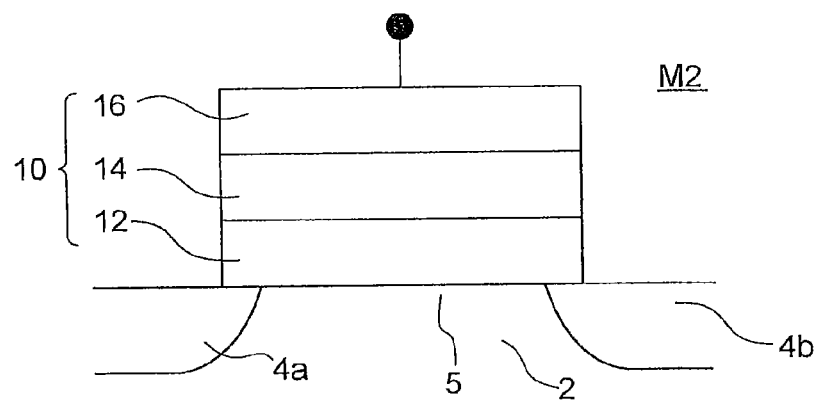
FIG. 4 is a sectional view showing a configuration of a read transistor according to the first embodiment.

FIG. 4 shows a device structure of the read transistor M2 in the present embodiment. The read transistor M2 is formed on a semiconductor region 2, and the read transistor M2 includes a source 4a and a drain 4b which are formed at a distance between in the semiconductor region 2 and which are formed of impurity regions having a conductivity type opposite to that of the semiconductor region 2. Incidentally, the semiconductor region means a semiconductor substrate, a well region, an SOI (Silicon On Insulator) layer, or the like. In addition, a gate structure 10 is formed on the semiconductor region 2 between the source 4a and the drain 4b. The gate structure 10 includes a gate insulation film 12, a threshold-modulating film 14, and a gate electrode (gate) 16.

The threshold-modulating film 14 is formed of a film including a charge trap film (for example, a SiN film or the like) capable of trapping charge, or including a ferroelectric material film or a transition metal oxide film (for example, the $Pb(Zr, Ti)O_3$(PZT) film, $SrBi_2Ta_2O_9$ (SBT) film, $(Bi, La)_4Ti_3O_{12}$(BLT) film or the like) capable of having polarization. For the gate electrode 16, n-type polysilicon, p-type polysilicon, or a metal gate electrode can be used. The threshold voltage of the read transistor M2 is modulated by injecting charge into the threshold-modulating film 14 via the gate electrode 16 or generating polarization by means of an electric field. Since injection of charge into the threshold-modulating film 14 is conducted via the gate electrode which is in contact with the threshold-modulating film 14, the write voltage can be made lower as compared with the flash memory.

Figure 5:
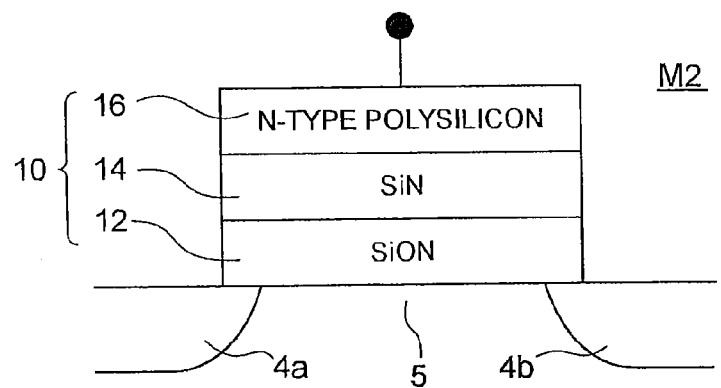
FIG. 5 is a sectional view showing a first concrete example of the read transistor according to the first embodiment.

FIG. 5 shows a first concrete example of the read transistor M2 in the case where a SiN film is used as the threshold-modulating film 14. In the first concrete example, a SiON film is used as the gate insulation film 12 considering matching with the threshold-modulating film 14 formed of SiN at an interface. As the gate electrode 16, n-type polysilicon is used.

Figure 6:
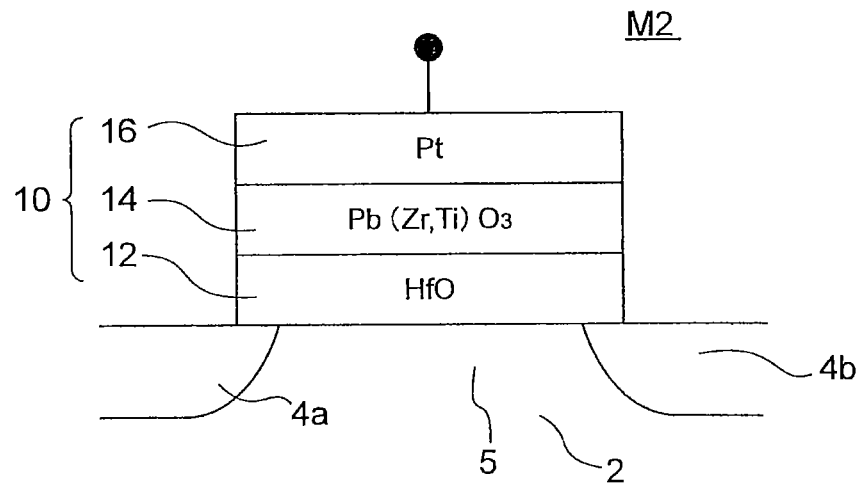
FIG. 6 is a sectional view showing a second concrete example of the read transistor according to the first embodiment.

Furthermore, it is also possible to use a ferroelectric material for the threshold-modulating film 14 and modulate the threshold voltage of the read transistor M2 by polarization. FIG. 6 shows a second concrete example of the read transistor M2 in the case where a PZT film which is a ferroelectric material is used as the threshold-modulating film 14. In the second concrete example, a HfO film is used as the gate insulation film 12 and platinum (Pt) is used as the gate electrode 16.

Figure 7:
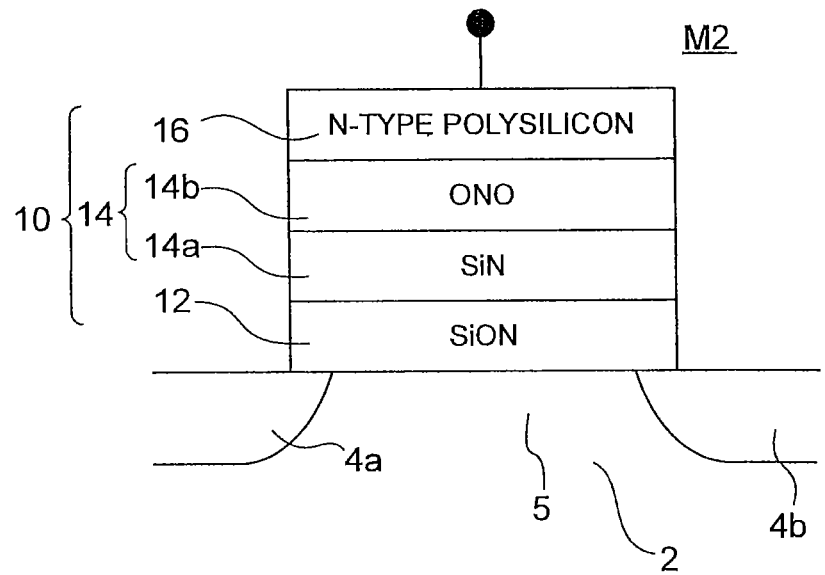
FIG. 7 is a sectional view showing a third concrete example of the read transistor according to the first embodiment.

Furthermore, it is possible to further prolong the retention time by providing a block insulation film at an interface between the threshold-modulating film 14 and the gate electrode 16 to prevent charge from flowing out. FIG. 7 shows a third concrete example of the read transistor M2 in the case where the threshold-modulating film 14 includes the block insulation film to prevent charge from flowing out. In the third concrete example, the threshold-modulating film 14 includes a SiN film 14a and an ONO (Oxide-Nitride-Oxide) film 14b provided on the SiN film 14a. Incidentally, the ONO film has a structure in which oxide films sandwich a nitride film between, i.e., an oxide film, a nitride film, and an oxide film are stacked in the cited order. In the third concrete example, a SiON film is used as the gate insulation film 12 considering matching to the SiN film 14a at an interface in the gate insulation film 12. As the gate electrode 16, n-type polysilicon is used.

Figure 8:
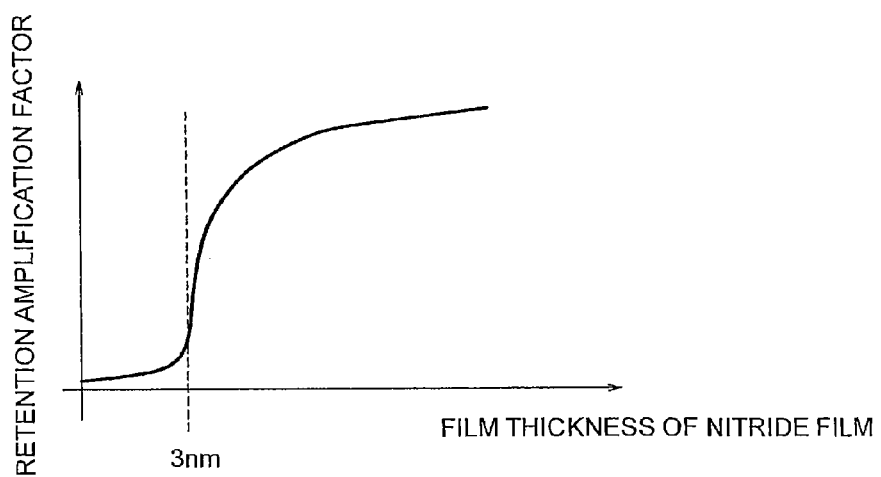
FIG. 8 is a diagram for explaining a feature in the case where a threshold-modulating film includes a nitride film.

A feature in the case where a nitride film is included as the threshold-modulating film 14 will now be described with reference to FIG. 8. A retention amplification factor obtained when the nitride film is included rises abruptly when the film thickness of the nitride film has become at least 3 nm as shown in FIG. 8. Here, the retention amplification factor is an amplification factor of retention time of a read transistor including the threshold-modulating film as compared with retention time of a read transistor which has the same equivalent oxide film thickness EOT (Equivalent Oxide Thickness) as the read transistor including the threshold-modulating film and which does not include a threshold-modulating film. This is because the quantity of charges trapped by the nitride film increases abruptly as the film thickness of the nitride film becomes thicker than 3 nm. For producing the effect of the present embodiment, therefore, it is desirable that the film thickness of the nitride film included in the threshold-modulating film 14 is at least 3 nm.

First Example

Figure 9:
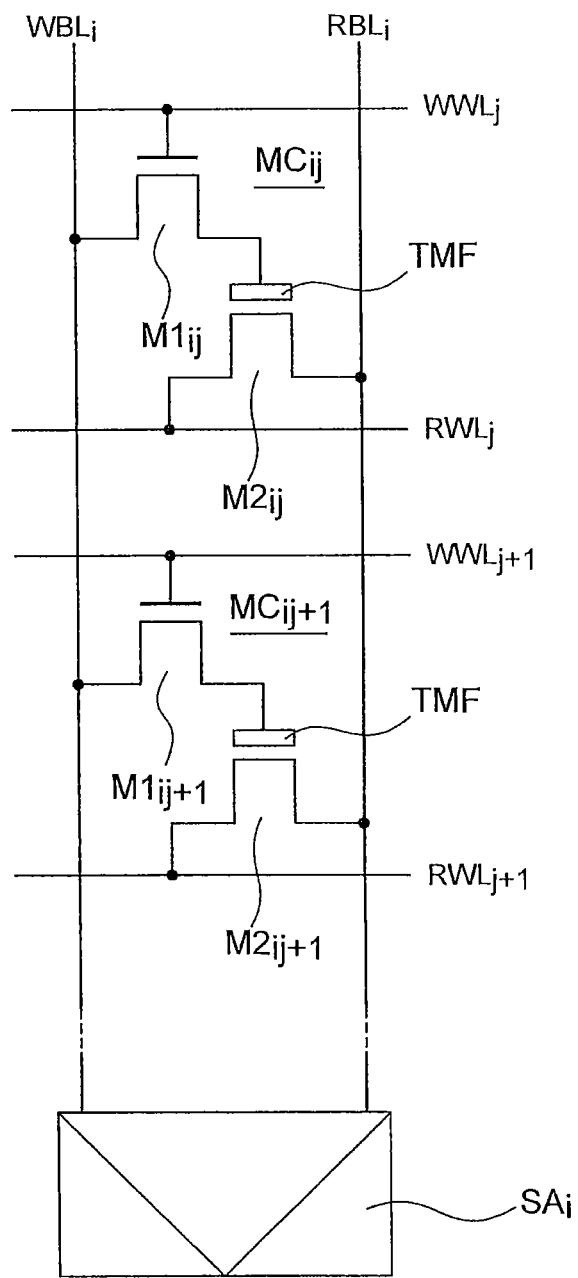
FIG. 9 is a circuit diagram showing a memory in a first example.

In general, a memory includes a cell array having a plurality of memory cells MC arranged in a matrix form. This cell array includes at least one bit line and at least one word line. A plurality of memory cells MC are connected to each bit line and each word line. A sense amplifier is provided on at least one bit line or at least one word line. FIG. 9 shows a circuit diagram of a first example of a memory according to the first embodiment in which a read bit line RBL and a write bit line WBL are connected to a sense amplifier SA. FIG. 9 is a circuit diagram showing a memory cell $MC_{ij}$ in an i-th (i=1, . . . ) column in a j-th (j=1, . . . ) row and a memory cell $MC_{ij+1}$ in the i-th (i=1, . . . ) column in a (j+1)-th (j=1, . . . ) row. A write transistor $M1_{ij}$ in each memory cell $MC_{ij}$ (i=1, . . . , j=1, . . . ) is connected at its gate to a write word line $WWL_j$, connected at one of its source and drain to a write bit line $WBL_i$, and connected at the other of its source and drain to a gate electrode of a read transistor $M2_{ij}$ in the memory cell $MC_{ij}$. A read transistor $M2_{ij}$ in each memory cell $MC_{ij}$ (i=1, . . . , j=1, . . . ) is connected at one of its source and drain to a read word line $RWL_j$, and connected at the other of its source and drain to a read bit line $RBL_i$. In other words, in the cell array in the memory shown in FIG. 9, one of the source and drain of the write transistor M1 in each of the memory cells $MC_{ij}$ and $MC_{ij+1}$ is connected to the write bit line $WBL_i$. The other of the source and drain of the read transistor M2 in each of the memory cells $MC_{ij}$ and $MC_{ij+1}$ is connected to the read bit line $RBL_i$. A sense amplifier $SA_i$ is connected to the write bit line $WBL_i$ (i=1, . . . ) and the read bit line $RBL_i$.

Second Example

Figure 10:
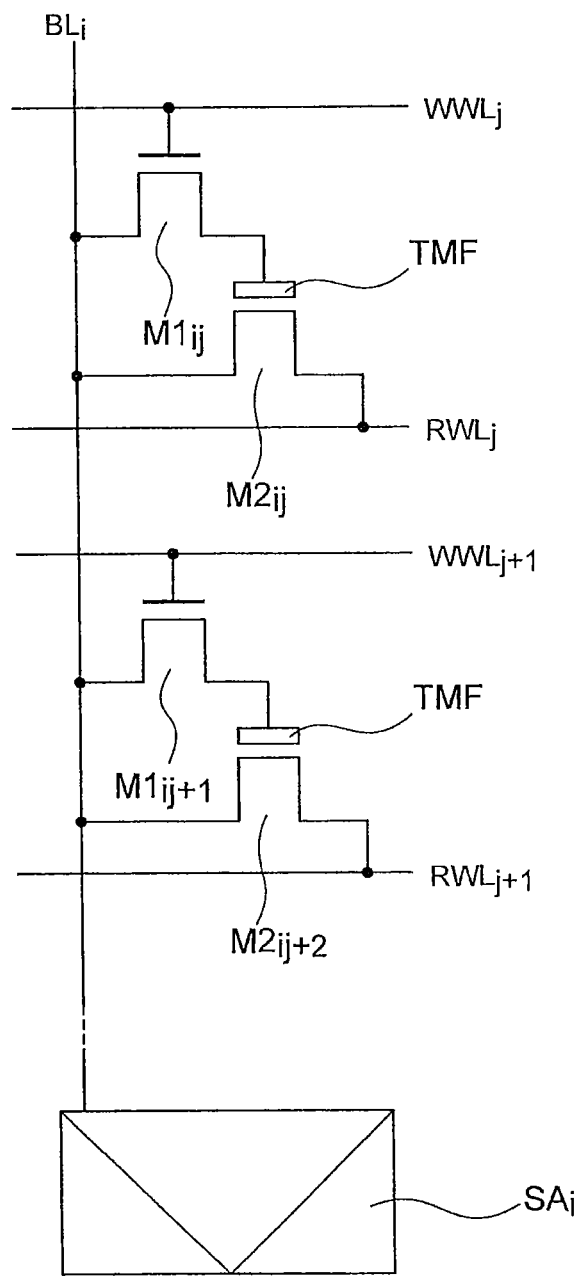
FIG. 10 is a circuit diagram showing a memory in a second example.

FIG. 10 is a circuit diagram of a second example of a memory in a case where the read bit line $RBL_i$ (i=1, . . . ) and the write bit line $WBL_i$ in the memory in the first example shown in FIG. 9 are replaced with a common bit line $BL_i$. In other words, the second example shown in FIG. 10 has a configuration in which one of the source and drain of each of the write transistor $M1_{ij}$ and the read transistor $M2_{ij}$ in each memory cell $MC_{ij}$ (i=1, . . . , j=1, . . . ) is connected to the bit line $BL_i$ and the sense amplifier $SA_i$ is connected to the bit line $BL_i$. Owing to such a configuration, the number of the bit lines can be reduced as compared with the first example.

Third Example

Figure 11:
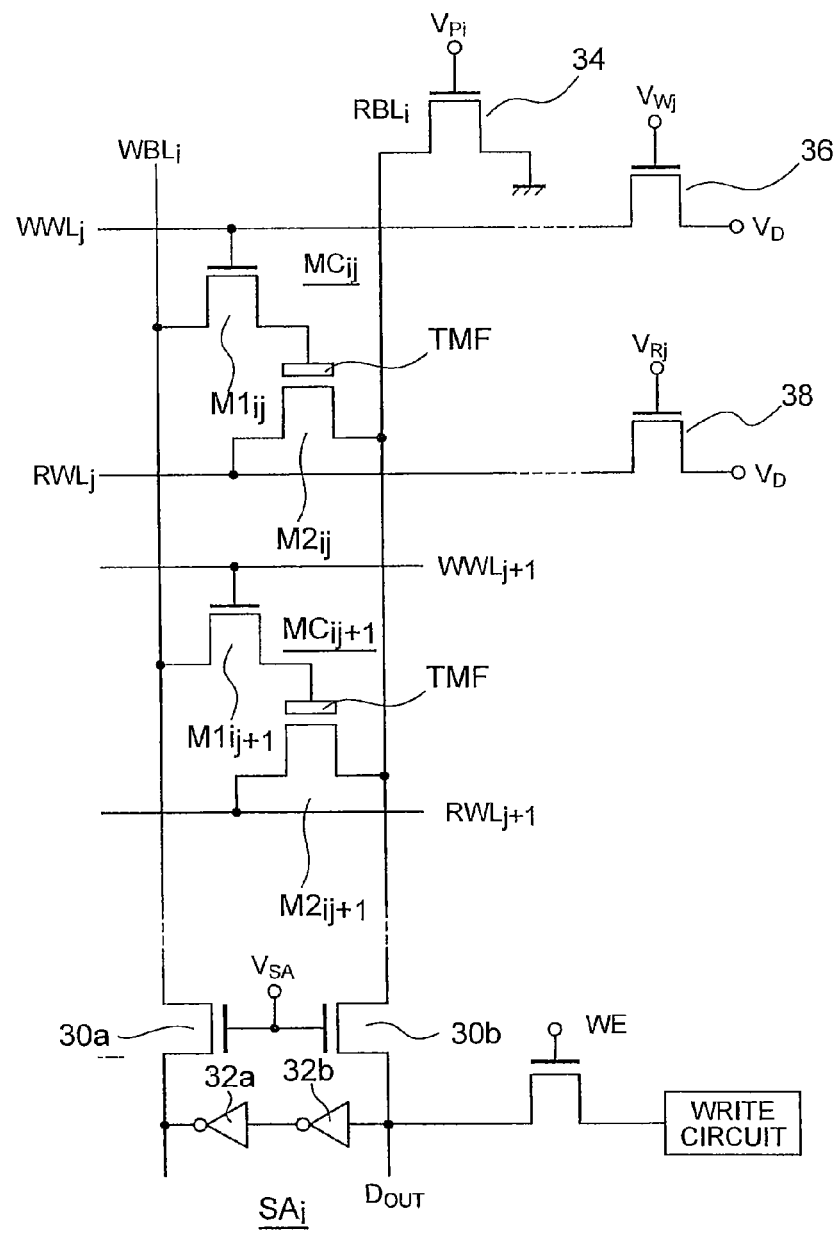
FIG. 11 is a circuit diagram showing a memory in a third example.
Figure 12:
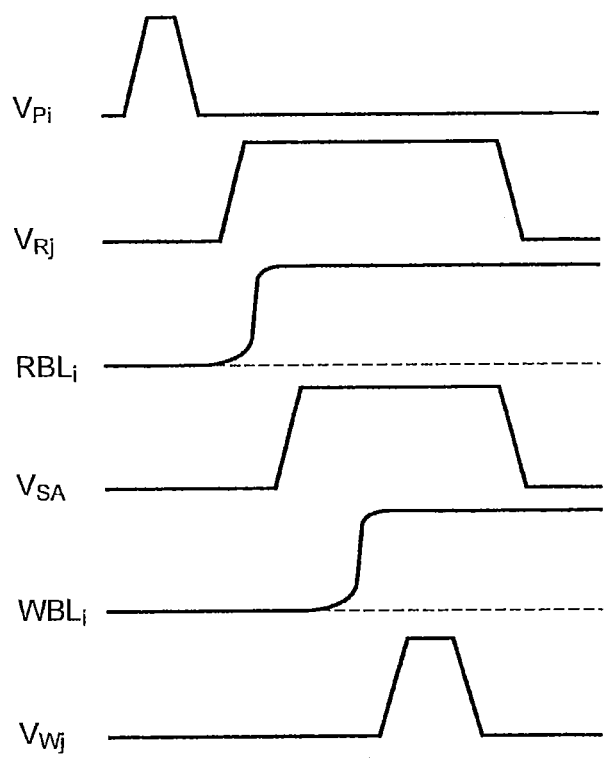
FIG. 12 is a waveform diagram for explaining refresh operation of a memory in the third example.

FIG. 11 is a circuit diagram showing a third example of the memory according to the first embodiment, and FIG. 12 is a waveform diagram for explaining its operation. Incidentally, FIG. 12 is a waveform diagram showing applied voltages ranging from reading to a refresh operation.

The memory in the third example has a configuration in which an inverter chain type sense amplifier is used as the sense amplifier $SA_i$ (i=1, . . . ) in the memory in the first example. The sense amplifier $SA_i$ (i=1, . . . ) includes read select transistors 30a and 30b and inverters 32a and 32b connected in series in two stages. The read select transistors 30a and 30b in the sense amplifier $SA_i$ (i=1, . . . ) are connected to the write bit line $WBL_i$ and the read bit line $RBL_i$, respectively. A read control voltage $V_{SA}$ is applied to gates of the read select transistors 30a and 30b.

In the sense amplifier $SA_i$ (i=1, . . . ), an output terminal of the inverter 32a is connected to the write bit line $WBL_i$ via the read select transistor 30a and an input terminal of the inverter 32b is connected to the read bit line $RBL_i$ via the read select transistor 30b.

Furthermore, a transistor 34 is connected at one of its source and drain to the read bit line $RBL_i$ (i=1, . . . ). The transistor 34 is connected at the other of its source and drain to ground, and a control voltage $V_{Pi}$ is applied to the transistor 34 at its gate.

In addition, a transistor 36 is connected at one of its source and drain to the write word line $RBL_i$ (i=1, . . . ). A potential $V_D$ is applied to the transistor 36 at the other of its source and drain, and a write control voltage $V_{Wj}$ is applied to the transistor 36 at its gate.

Furthermore, a transistor 38 is connected at one of its source and drain to the read word line $RWL_j$ (j=1, . . . ). A potential $V_D$ is applied to the transistor 38 at the other of its source and drain, and a read control voltage $V_{Rj}$ is applied to the transistor 38 at its gate.

The refresh operation of the memory in the third example will now be described with reference to FIG. 12.

First, the control voltage $V_{Pi}$ is brought to its "H" level to turn on the transistor 34, and thereby a potential on the read bit line $RBL_i$ in a column to be read, for example, an i-th (i=1, . . . ) column is brought to the ground potential. Then, the control voltage $V_{Pi}$ is brought to its "L" level to turn off the transistor 34.

Then, the read control voltage $V_{Rj}$ applied to the gate of the transistor 38 connected to the word line $RWL_j$ in a row to be read, for example, a j-th (j=1, . . . ) row is brought to the "H" level to turn on the transistor 38. As a result, a potential on the read word line $RWL_j$ in the j-th (j=1, . . . ) row to be read is raised up to $V_D$. If at this time data stored in a memory cell $MC_{ij}$ is "1," i.e., if a read transistor $M2_{ij}$ is in the on-state, the potential on the read word line $RWL_j$ is conveyed to the read bit line $RBL_i$ and a potential on the read bit line $RBL_i$ also becomes $V_D$.

On the other hand, if data stored in the memory cell $MC_{ij}$ is "0," i.e., if the read transistor $M2_{ij}$ is in the off-state, the potential on the read word line $RWL_j$ is not conveyed to the read bit line $RBL_i$ and the potential on the read bit line $RBL_i$ remains 0. Data recorded in the memory cell can be read by reading the potential on the read bit line $RBL_i$. This reading is conducted by activating the sense amplifier $SA_i$. As for the activation of the sense amplifier $SA_i$, the control voltage $V_{SA}$ is brought to the "H" level to turn on the transistors 30a and 30b. Thereupon, the potential on the read bit line $RBL_i$ is conveyed to the write bit line $WBL_i$ via the inverter chains 32a and 32b. In this state, the write control voltage $V_{Wj}$ in a row to be written, for example, in the j-th (j=1, . . . ) row is brought to the "H" level to turn on the transistor 36. As a result, the potential level on the write word line $WWL_j$ becomes $V_D$, the write transistor $M1_{ij}$ turns on, and writing of data depending upon the potential on the write bit line $WBL_i$ into the memory cell $MC_{ij}$ is conducted. Accordingly, the refresh operation can be conducted. In the foregoing description, the case where data stored in a memory cell is "0" is associated with the off-state of the read transistor whereas the case where the data is "1" is associated with the on-state of the read transistor. However, reverse association can be conducted. In other words, it is also possible to associate the case where data stored in a memory cell is "0" with the on-state of the read transistor and associate the case where the data is "1" with the off-state of the read transistor.

An operation for writing into or reading from the memory cell is conducted in the same way as the operation for writing into or reading from the memory cell in the refresh operation described above. Writing is made possible by inputting data to be written from a write circuit regardless of data which is read. Incidentally, data $D_{OUT}$ which is read is output to the external from the input terminal of the inverter 32b.

Fourth Example

Figure 13:
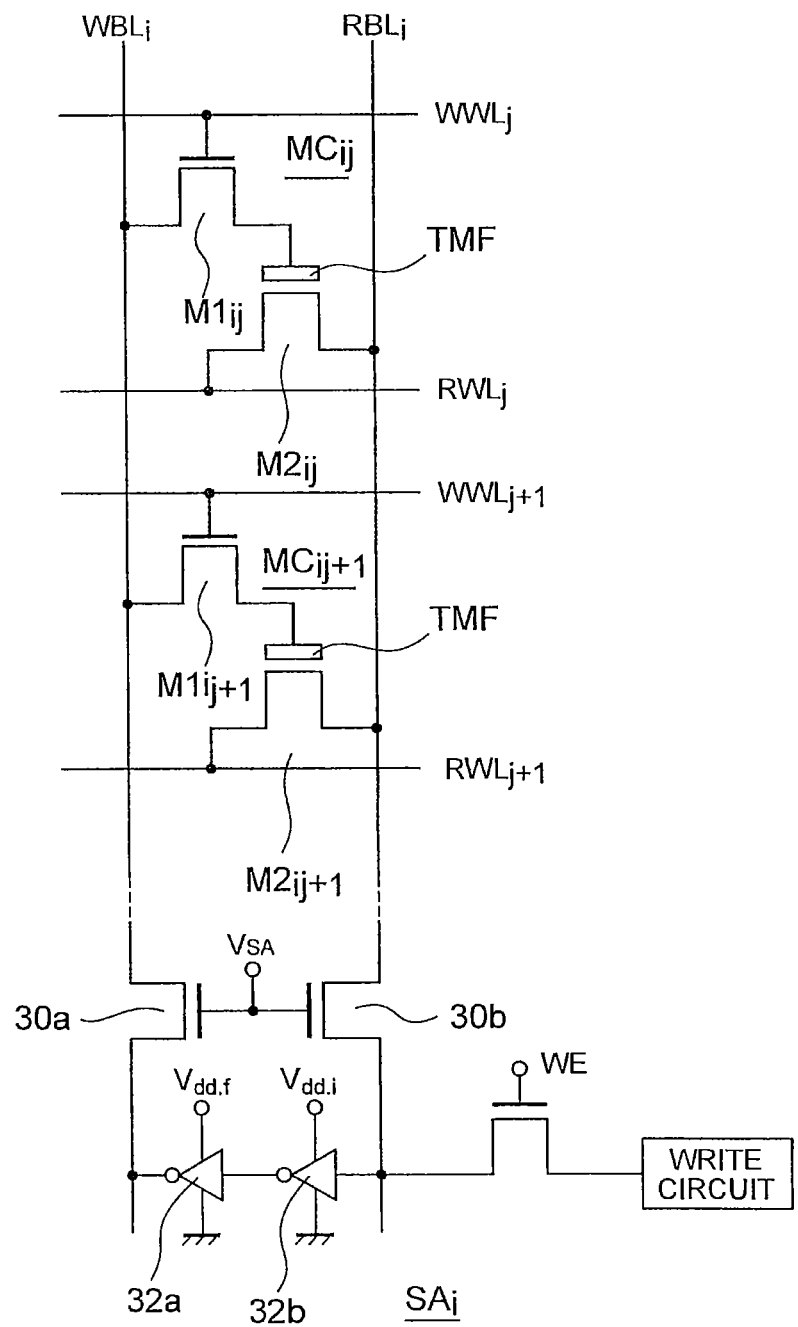
FIG. 13 is a circuit diagram showing a memory in a fourth example.

A memory in a fourth example is shown in FIG. 13. The memory in the fourth example has a configuration obtained by making a power supply voltage $V_{ddf}$ of the inverter 32a in the latter stage greater than a power supply voltage $V_{ddi}$ of the inverter 32b in the preceding stage in the memory in the third example shown in FIG. 11. In the fourth example, the voltage on the write bit line $WBL_j$ can be made high and it becomes possible to store more charges.

Fifth Example

Figure 14:
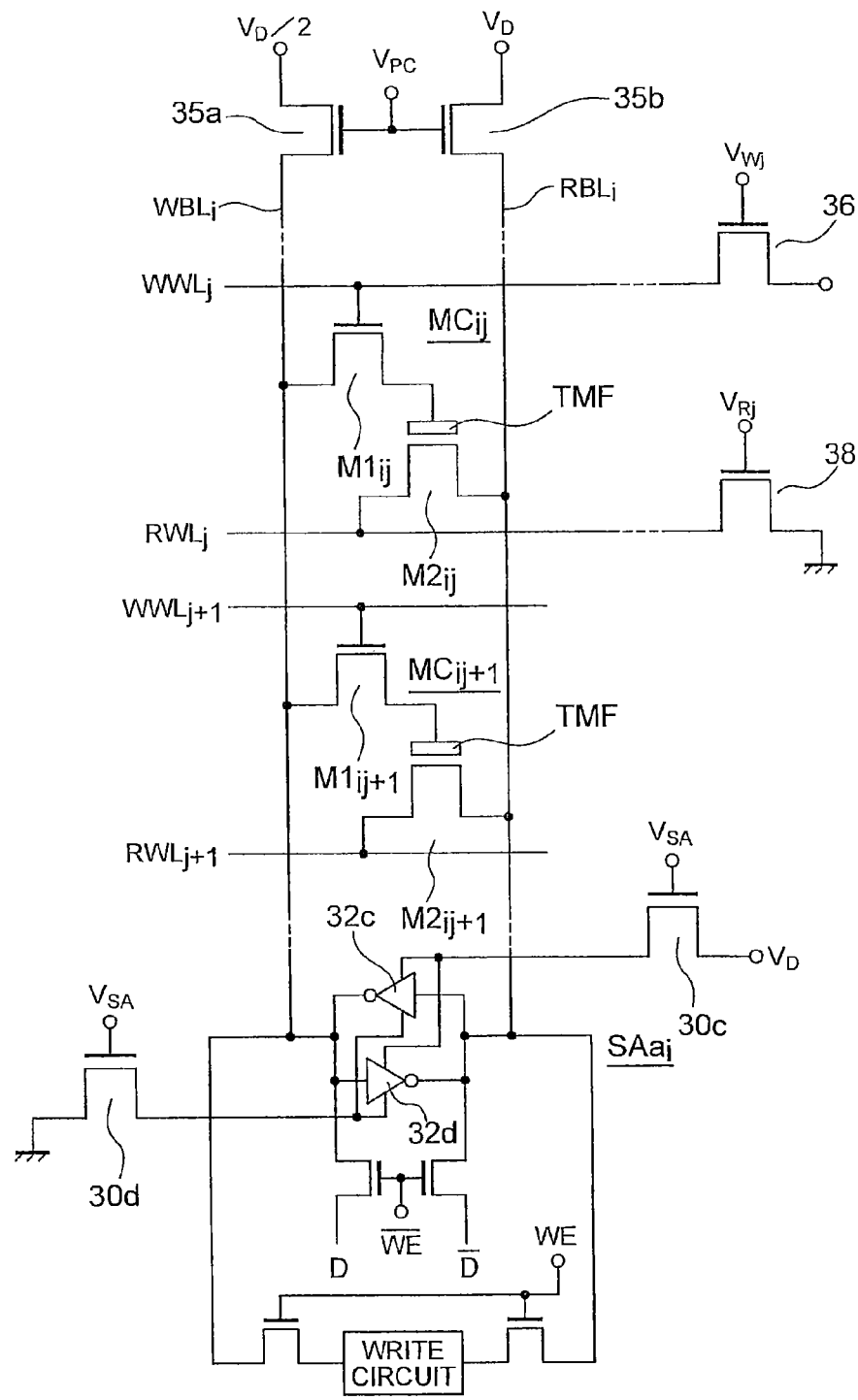
FIG. 14 is a circuit diagram showing a memory in a fifth example.

A memory in a fifth example is shown in FIG. 14. The memory in the fifth example has a configuration obtained by providing transistors 35a and 35b instead of the transistor 34 in the memory in the third example shown in FIG. 11 and providing a sense amplifier $SAa_i$ instead of the sense amplifier $SA_i$ (i=1, . . . ).

The transistor 35a is connected at one of its source and drain to the write bit line $WBL_i$. A potential $V_D/2$ is applied to the transistor 35a at the other of its source and drain, and the transistor 35a receives a control voltage $V_{PC}$ at its gate. Furthermore, the transistor 35b is connected at one of its source and drain to the read bit line $RBL_i$. A potential $V_D$ is applied to the transistor 35b at the other of its source and drain, and the transistor 35b receives the control voltage $V_{PC}$ at its gate.

The sense amplifier $SAa_i$ (i=1, . . . ) includes transistors 30c and 30d, and a latch circuit formed of cross-couple-connected inverters 32c and 32d. The potential $V_D$ is applied to the transistor 30c at one of its source and drain, and the transistor 30c is connected at the other of its source and drain to a power supply terminal of the inverters 32c and 32d. A control voltage $V_{SA}$ is applied to the transistor 30c at its gate. The transistor 30d is connected at one of its source and drain to the power supply terminal of the inverters 32c and 32d, and connected at the other of its source and drain to the ground. The control voltage $V_{SA}$ is applied to the transistor 30d at its gate.

An input terminal of the inverter 32c and an output terminal of the inverter 32d are connected to the read bit line $RBL_i$, and an output terminal of the inverter 32c and an input terminal of the inverter 32d are connected to the write bit line $WBL_i$.

In FIG. 14, D and /D represent data read lines. A write circuit and the data read lines D and /D are connected exclusively. In other words, when reading, a write enable signal WE becomes the "L" level and the write circuit is cut off. When writing, the data lines D and /D are cut off.

Figure 15:
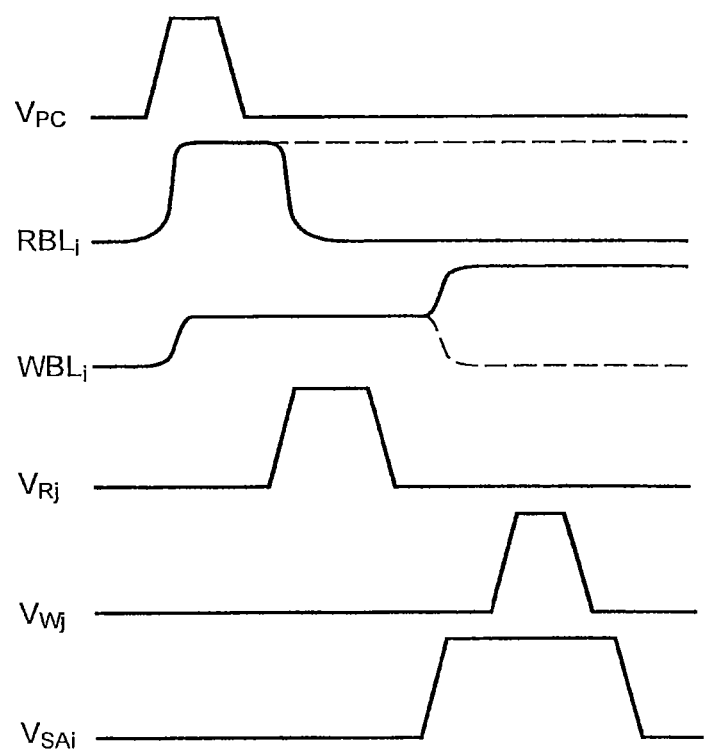
FIG. 15 is a waveform diagram for explaining refresh operation of a memory in the fifth example.

In the memory in the fifth example having such a configuration, the refresh operation of a selected memory cell becomes possible by applying voltages in a sequence shown in FIG. 15. First, the potential $V_{PC}$ is brought to "H" to precharge the read bit line $RBL_i$ to $V_D$ and the write bit line $WBL_i$ to $V_D/2$. Then, the potential $V_{Rj}$ is brought to "H." If data stored in the memory cell $MC_{ij}$ is "0," therefore, the potential on the read bit line $RBL_i$ is retained. If the stored data is "1," then charge gets away via the read word line $RWL_j$ and the potential on the read bit line $RBL_i$ becomes 0. Then, the potential $V_{SAi}$ is brought to "H" to couple the power supply of the sense amplifier and latch data on the read bit line. If data stored in the memory cell $MC_{ij}$ is "1," then the write bit line $WBL_i$ becomes "H." If the stored data is "0," then the write bit line $WBL_i$ becomes "L." Finally, the potential $V_{Wj}$ is brought to "H" to conduct writing into the memory cell $MC_{ij}$ and complete the refresh operation. As for data reading, data can be read from the two output terminals D and /D of the cross-coupled inverters. Furthermore, at the time of writing, writing is made possible by inputting desired data from the write circuit regardless of data which is read. In the foregoing description, the pair of $V_D$ and $V_D/2$ is used as the precharge potentials. As long as the potential difference between bit lines is inverted when the stored data is "1" and the difference can be amplified by the sense amplifier, however, a pair of, for example, $V_D/2$ and $V_D/4$ can be used.

In the fifth example, data reading is conducted by sensing the difference between the voltage on the read bit line $RBL_i$ and the voltage on the write bit line $WBL_i$. As compared with the third example in which it is necessary to directly charge the bit line and drive the inverters, the time required for the sense amplifier to read the value "1" is shortened and the reading speed is improved.

Sixth Example

Figure 16:
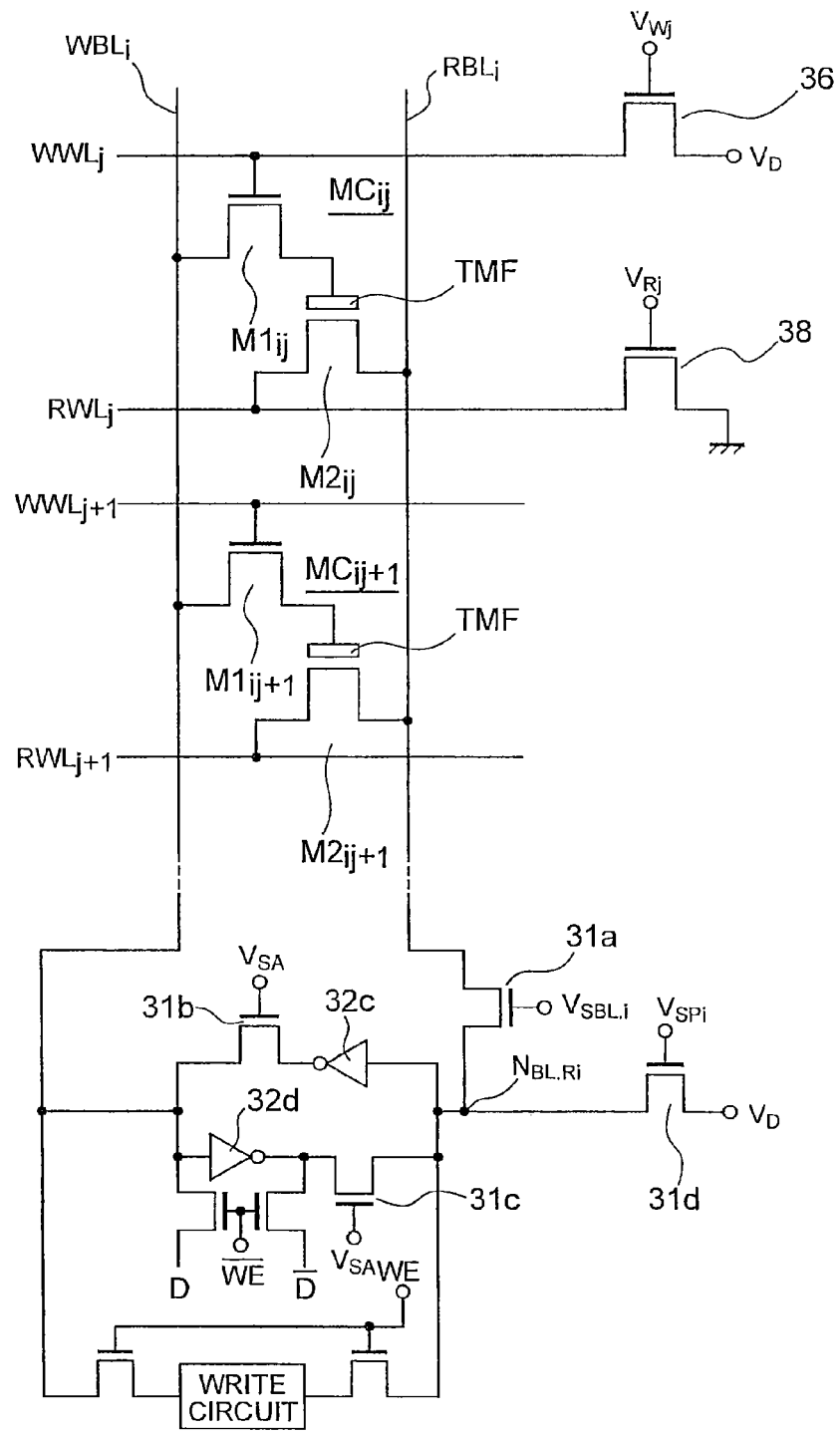
FIG. 16 is a circuit diagram showing a memory in a sixth example.

FIG. 16 shows a memory in a sixth example. The memory in the sixth example has a configuration obtained by eliminating the transistor 34 in the memory in the third example shown in FIG. 11 and replacing the sense amplifier $SA_i$ with a sense amplifier $SAb_i$.

The sense amplifier $SAb_i$ includes transistors 31a, 31b, 31c and 31d, and a latch circuit formed of inverters 32c and 32d. The transistor 31a is connected at one of its source and drain to the read bit line $RBL_i$, and connected at the other of its source and drain to a node $N_{BLRi}$. The transistor 31a receives a control voltage $V_{SBLi}$ at its gate. The transistor 31b is connected at one of its source and drain to the write bit line $WBL_i$, and connected at the other of its source and drain to an output terminal of the inverter 32c. The transistor 31b receives a sense amplifier control voltage $V_{SA}$ at its gate. The transistor 31c is connected at one of its source and drain to an output terminal of the inverter 32c, and connected at the other of its source and drain to the node $N_{BLRi}$. The transistor 31c receives a sense amplifier control voltage $V_{SA}$ at its gate. The transistor 31d is connected at one of its source and drain to the node $N_{BLRi}$. A potential $V_D$ is applied to the other of the source and drain of the transistor 31d, and the transistor 31d receives a control voltage $V_{SPi}$ at its gate.

Figure 17:
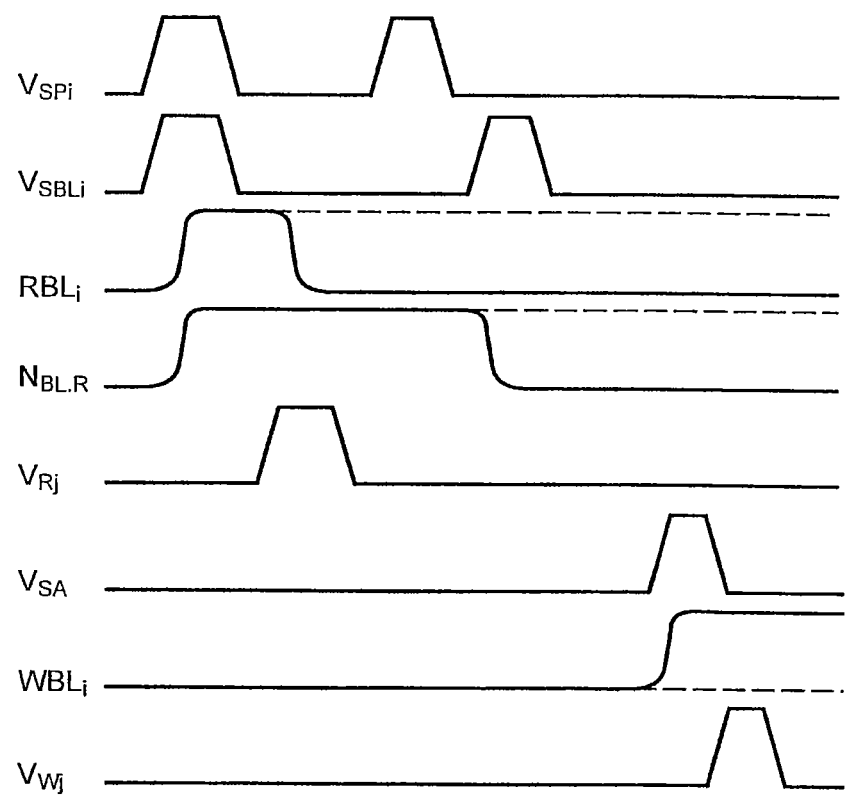
FIG. 17 is a waveform diagram for explaining refresh operation of a memory in the sixth example.

In the memory in the sixth example having such a configuration, the refresh operation of a selected memory cell becomes possible by applying voltages in a sequence shown in FIG. 17. First in this sequence, the control voltage $VSP_i$ and the control voltage $VSBL_i$ are brought to the "H" level to turn on the transistors 31a and 31d. Thereupon, gigantic parasitic capacitance on the read bit line $RBL_i$ is charged and the potential on the read bit line $RBL_i$ rises. After the transistors 31a and 31d are turned off, the potential $V_{Rj}$ is brought to the "H" level. If data retained in the memory cell $MC_{ij}$ is "0," then the read transistor $M2_{ij}$ is in the off-state and the potential on the read bit line $RBL_i$ is retained. If the retained data is "1," then the read transistor $M2_{ij}$ is in the on-state and the potential on the read bit line $RBL_i$ falls. Then, the parasitic capacitance on the node $N_{BLRi}$ is charged again, and the transistor 31a is turned on to connect the node $N_{BLRi}$ to the read bit line $RBL_i$. The parasitic capacitance on the node $N_{BLRi}$ is smaller than parasitic capacitance of the read bit line $RBL_i$. If the potential on the read bit line $RBL_i$ is high, the potential on the node $N_{BLRi}$ does not change. If the potential on the read bit line $RBL_i$ is low, the potential on the node $N_{BLRi}$ falls largely. Then, the potential $V_{SA}$ is brought to the "H" level to drive the sense amplifier $SAb_i$ and read the potential on the node $N_{BLRi}$. A reading method robust to noise can be implemented by converting data information to a potential on the gigantic capacitance of the read bit line $RBL_i$ earlier and reading voltage by means of a small parasitic capacitance of the node $N_{BLRi}$ connected thereto.

As for data reading, it becomes possible to read data from the input and output terminals of the inverter 32d. Furthermore, writing is made possible by inputting data to be written from a write circuit regardless of data which is read.

Seventh Example

Figure 18:
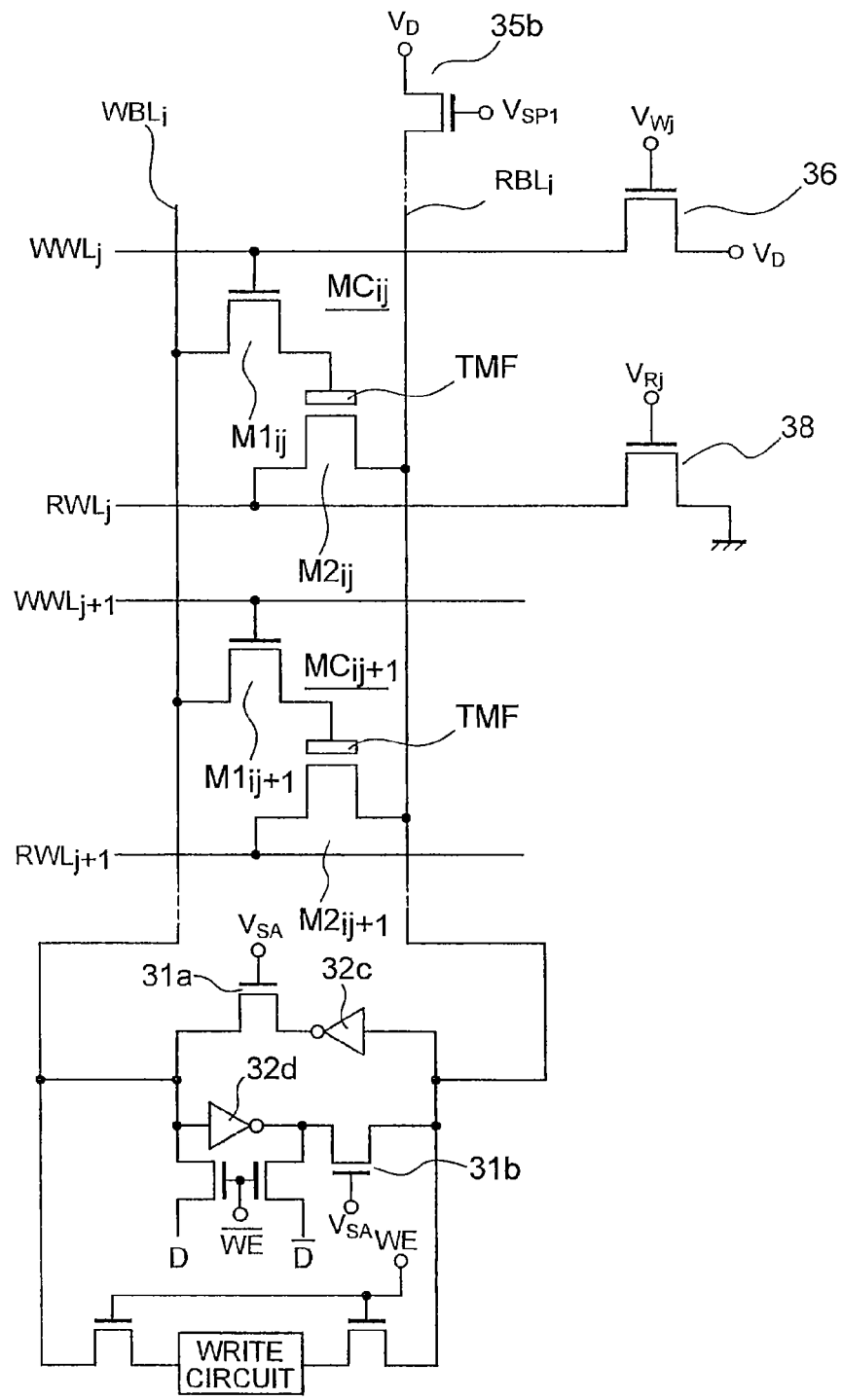
FIG. 18 is a circuit diagram showing a memory in a seventh example.

FIG. 18 shows a memory in a seventh example. The memory in the seventh example has a configuration obtained by newly providing a transistor 35b for precharge in the memory in the sixth example shown in FIG. 16 and replacing the sense amplifier $SAb_i$ with a sense amplifier $SAc_i$. The sense amplifier $SAc_i$ has a configuration obtained by eliminating the transistors 31a and 31d for precharge from the sense amplifier $SAb_i$. As compared with the memory in the sixth example, therefore, the memory in the seventh example has a configuration in which one transistor for precharge is eliminated every column. In this way, in the seventh example, one transistor between the read bit line $RBL_i$ and the latch circuit in the sense amplifier $SAc_i$ can be reduced and it becomes possible to reduce the resistance between them.

Incidentally, in the seventh example, the transistor 31b is connected at one of its source and drain to the read bit line $RBL_i$. Furthermore, the transistor 35b is connected at one of its source and drain to the read bit line $RBL_i$ and the potential $V_D$ is applied to the transistor 35b at the other of its source and drain. The control voltage $V_{SPi}$ is applied to the transistor 35b at its gate.

According to the present embodiment and respective examples, the following effects can be obtained as described heretofore:
1) extension of retention time;
2) improvement of reading speed;
3) lower power consumption; and
4) improvement of noise resistance.

In other words, it is possible to provide a semiconductor device capable of conducting normal reading without requiring frequent refresh operations.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

The invention claimed is:

1. A semiconductor device comprising:
a first transistor including a gate connected to a first interconnection, a first source, and a first drain, one of the first source and the first drain being connected to a second interconnection; and
a second transistor including a gate structure, a second source, and a second drain, one of the second source and second drain being connected to a third interconnection and the other of the second source and second drain being connected to a fourth interconnection,
wherein the gate structure includes a gate insulation film, a gate electrode, and a threshold-modulating film provided between the gate insulation film and the gate electrode to modulate a threshold voltage, the other of the first source and first drain of the first transistor is connected to the gate electrode, the threshold-modulating film including a nitride film of which thickness is at least 3 nm.

2. A semiconductor device comprising
a first transistor including a gate connected to a first interconnection, a first source, and a first drain, one of the first source and the first drain being connected to a second interconnection; and
a second transistor including a gate structure, a second source, and a second drain, one of the second source and the second drain being connected to a third interconnection and the other of the second source and the second drain being connected to the second interconnection,
wherein the gate structure includes a gate insulation film, a gate electrode, and a threshold-modulating film provided between the gate insulation film and the gate electrode to modulate a threshold voltage, the other of the first source and first drain of the first transistor being connected to the gate electrode.

3. The device according to claim 2, wherein the threshold-modulating film comprises a trap film to trap charge.

4. The device according to claim 3, wherein the threshold-modulating film comprises a block insulation film at an interface to the gate electrode to prevent charge from flowing out.

5. The device according to claim 1, wherein the threshold-modulating film comprises a ferroelectric material film or a transition metal oxide film.

6. The device according to claim 2, further comprising a sense amplifier connected to the second interconnection to detect whether the second transistor is in an on-state or in an off-state.

7. The device according to claim 6, wherein the sense amplifier comprises a plurality of inverters connected in series.

8. The device according to claim 7, wherein a power supply voltage of an inverter in a final stage of the sense amplifier is greater than a power supply voltage of an inverter in a first stage of the sense amplifier.

9. The device according to claim 6, wherein the sense amplifier comprises a latch circuit in which at least two inverters are cross-couple-connected.

10. The device according to claim 6, further comprising a precharge circuit to precharge the second interconnection.

11. The device according to claim 2, wherein the threshold-modulating film includes a nitride film of which thickness is at least 3 nm.

12. The device according to claim 1, wherein the threshold-modulating film comprises a trap film to trap charge.

13. The device according to claim 12, wherein the threshold-modulating film comprises a block insulation film at an interface to the gate electrode to prevent charge from flowing out.

14. The device according to claim 1, further comprising a sense amplifier connected to the second interconnection and the fourth interconnection to detect whether the second transistor is in an on-state or in an off-state.

15. The device according to claim 14, wherein the sense amplifier comprises a plurality of inverters connected in series.

16. The device according to claim 15, wherein a power supply voltage of an inverter in a final stage of the sense amplifier is greater than a power supply voltage of an inverter in a first stage of the sense amplifier.

17. The device according to claim 14, wherein the sense amplifier comprises a latch circuit in which at least two inverters are cross-couple-connected.

18. The device according to claim 14, further comprising a precharge circuit to precharge at least one of the second interconnection and the fourth interconnection.

* * * * *